United States Patent
Morikawa

(10) Patent No.: US 9,806,222 B2
(45) Date of Patent: Oct. 31, 2017

(54) PRODUCTION METHOD FOR SOLAR CELL MODULE AND PRODUCTION DEVICE FOR SOLAR CELL MODULE

(71) Applicant: Panasonic Intellectual Property Management Co., Ltd., Osaka-shi, Osaka (JP)

(72) Inventor: Ryota Morikawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/812,381

(22) Filed: Jul. 29, 2015

(65) Prior Publication Data

US 2015/0340543 A1 Nov. 26, 2015

Related U.S. Application Data

(63) Continuation of application No. PCT/JP2014/000303, filed on Jan. 22, 2014.

(30) Foreign Application Priority Data

Feb. 1, 2013 (JP) .................................. 2013-018629

(51) Int. Cl.
*H01L 31/18* (2006.01)
*B32B 37/12* (2006.01)
(Continued)

(52) U.S. Cl.
CPC ...... *H01L 31/1876* (2013.01); *B32B 37/1284* (2013.01); *B32B 37/18* (2013.01);
(Continued)

(58) Field of Classification Search
CPC ... H01L 31/188; H01L 31/0465; H01L 31/05; H01L 31/0516; H01L 31/1876;
(Continued)

(56) References Cited

U.S. PATENT DOCUMENTS 5,391,235 A * 2/1995 Inoue ................ H01L 31/03921
136/244
2009/0183759 A1 7/2009 Hishida
(Continued)

FOREIGN PATENT DOCUMENTS

| EP | 2722895 A1 | 4/2014 | |
| JP | 2005191479 A | 7/2005 | |
| JP | 2009176782 A | 8/2009 | |
| JP | WO 2010140503 A1 * | 12/2010 | ....... H01L 21/67132 |
| JP | WO 2011016237 A1 * | 2/2011 | ....... H01L 21/67092 |
| JP | 2012182168 A | 9/2012 | |

(Continued)

OTHER PUBLICATIONS

International Search Report corresponding to Application No. PCT/JP2014/000303; dated Feb. 25, 2014.

*Primary Examiner* — John Goff
(74) *Attorney, Agent, or Firm* — Cantor Colburn LLP

(57) ABSTRACT

A production method for a solar cell module, having: a first step in which a first solar cell and a second solar cell are arranged so as to be adjacent to each other; a second step in which a heat-curable resin film as an adhesive is arranged on the first solar cell and the second solar cell; a third step in which a connection member is arranged upon the adhesive, so as to straddle the first solar cell and the second solar cell; a fourth step in which pressure is applied simultaneously to the sections of the connection member that overlap the first solar cell and the second solar cell, and the connection member is temporarily fixed to the first solar cell and the second solar cell; and a fifth step in which the connection member is fixed to the first solar cell and the second solar cell by curing the adhesive.

4 Claims, 4 Drawing Sheets

(51) Int. Cl.
*B32B 37/18* (2006.01)
*H01L 31/048* (2014.01)
*H01L 31/05* (2014.01)
*H01L 31/049* (2014.01)

(52) U.S. Cl.
CPC .......... *H01L 31/048* (2013.01); *H01L 31/049* (2014.12); *H01L 31/0481* (2013.01); *H01L 31/0516* (2013.01); *H01L 31/188* (2013.01); *B32B 2307/20* (2013.01); *B32B 2457/12* (2013.01); *Y02E 10/50* (2013.01); *Y10T 156/1092* (2015.01)

(58) Field of Classification Search
CPC .............. H01L 31/0508; H01L 31/0512; H01L 31/0504; H01L 31/0392; H01L 31/03926; H01L 31/03928; Y10T 156/1089; Y10T 156/1092; B32B 2457/12
USPC .......................................................... 138/244
See application file for complete search history.

(56) References Cited

U.S. PATENT DOCUMENTS

| | | | | |
|---|---|---|---|---|
| 2010/0084001 | A1* | 4/2010 | Tsunomura | H01L 31/0747 136/244 |
| 2010/0181011 | A1* | 7/2010 | Hashimoto | H01L 31/188 156/166 |
| 2012/0077302 | A1* | 3/2012 | Abe | H01L 21/67132 438/80 |
| 2012/0125536 | A1* | 5/2012 | Morimoto | H01L 21/67092 156/297 |
| 2013/0333743 | A1 | 12/2013 | Ishii et al. | |

FOREIGN PATENT DOCUMENTS

| | | | | |
|---|---|---|---|---|
| JP | 2012256697 | A | 12/2012 | |
| JP | 2013073971 | A | 4/2013 | |
| JP | 2013225615 | A | * 10/2013 | ......... H01L 31/0516 |

* cited by examiner

PRODUCTION METHOD FOR SOLAR CELL MODULE AND PRODUCTION DEVICE FOR SOLAR CELL MODULE

CROSS-REFERENCE TO RELATED APPLICATION

The present application is a continuation under 35 U.S.C. §120 of PCT/JP2014/000303, filed Jan. 22, 2014, which is incorporated herein by reference and which claimed priority under 35 U.S.C. §119 to Japanese Patent Application No. 2013-018629 filed Feb. 1, 2013, the entire content of which is also incorporated herein by reference.

TECHNICAL FIELD

The present invention relates to a production method for a solar cell module and a production device for the same.

BACKGROUND ART

To form a solar cell system easily, a plurality of solar cells are arranged in a plane to be integrated as a solar cell module.

Patent Literature 1 discloses a solar cell module using a back contact solar cell. Patent Literature 1 discloses a production method for the solar cell module using the back contact solar cell in which an n-side electrode of a solar cell and a p-type electrode of another solar cell adjacent to the solar cell are connected by a wiring material to form the solar cell module. The wiring material uses solder to join the n-side electrode and a p-side electrode.

To improve power generation efficiency of back contact solar cells, it has been considered to make wiring patterns thinner.

CITATION LIST

Patent Literature

PATENT LITERATURE 1: Japanese Patent Laid-Open Publication No. 2012-182168

SUMMARY OF INVENTION

Technical Problem

In thinning wiring patterns, percolation of solder may cause a leak between adjacent electrodes, and thus, connection using an adhesive has been considered. Improvement of a yield in a step of such connection using an adhesive has been demanded.

Solution to Problem

A production method for a solar cell module of the present invention comprises: a first step in which a first solar cell and a second solar cell are arranged so as to be adjacent to each other; a second step in which an adhesive is arranged on the first solar cell and the second solar cell; a third step in which a connection member is arranged upon the adhesive, so as to straddle the first solar cell and the second solar cell; a fourth step in which pressure is applied simultaneously to sections of the connection member that overlap the first solar cell and the second solar cell, and the connection member is temporarily fixed to the first solar cell and the second solar cell; and a fifth step in which the connection member is fixed to the first solar cell and the second solar cell by curing the adhesive.

A production device for a solar cell module of the present invention including: means arranging a first solar cell and a second solar cell so as to be adjacent to each other; means arranging an adhesive on the first solar cell and the second solar cell; means arranging a connection member upon the adhesive, so as to straddle the first solar cell and the second solar cell; means applying pressure simultaneously to sections of the connection member that overlap the first solar cell and the second solar cell, and temporarily fixing the connection member to the first solar cell and the second solar cell; and means fixing the connection member to the first solar cell and the second solar cell by curing the adhesive.

Advantageous Effect of Invention

The above configurations enable efficient production of a solar cell module with a good yield.

DESCRIPTION OF EMBODIMENT

Figure 1:
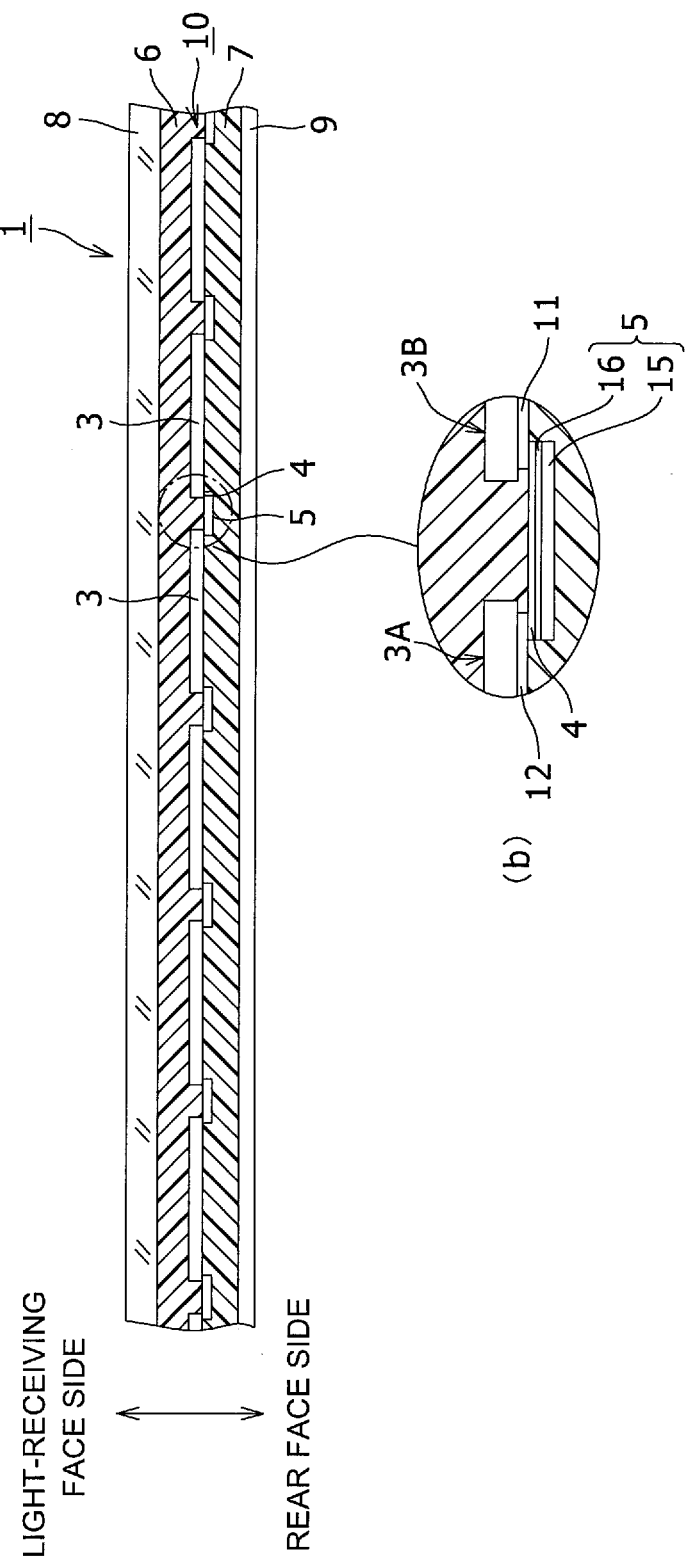
FIG. 1 is a sectional view of a solar cell module produced by a production method for a solar cell module of an example of an embodiment of the present invention.

Hereinafter, detailed descriptions will be given of an embodiment of the present invention with reference to the drawings. In the following descriptions, similar elements will be denoted by the same reference character throughout the drawings, and an overlapping description thereof will be omitted.

Figure 2:
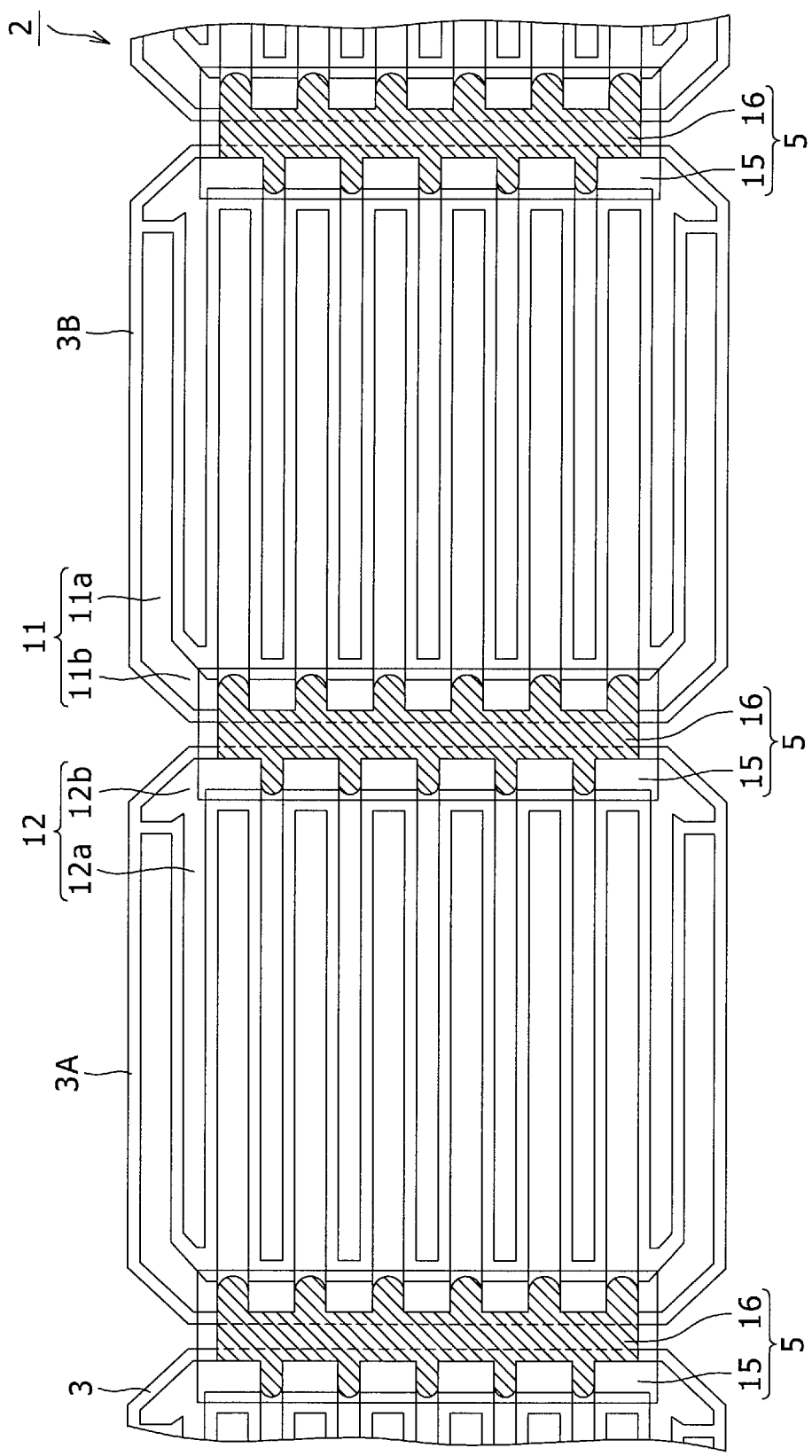
FIG. 2 is a diagram illustrating a connection structure of a solar cell string in FIG. 1.

FIG. 1(a) is a sectional view of a solar cell module 1. FIG. 1(b) is a partial enlarged view of FIG. 1(a). FIG. 2 is a plan view of the solar cell module 1 in FIG. 1, viewed from a rear face side.

The solar cell module 1 is configured by laminating a light-receiving face protecting member 8, a light-receiving face filler 6, a solar cell connection unit 10, a rear face filler 7 and a rear face protecting member 9, in this order.

The light-receiving face protecting member 8 uses a plate or a film having translucency and weather resistance, such as humidity resistance. As the light-receiving face protecting member 8, a glass plate, a resin plate, a resin film or the like may be used.

The light-receiving face filler 6 uses a resin film having translucency and flexibility. As the light-receiving face filler 6, a film of EVA, EEA, PVB, silicone resin, urethane resin, acrylic resin, epoxy resin or the like may be used.

The rear face filler 7 uses a resin film having flexibility. As the rear face filler 7, like the light-receiving face filler 6, a film of EVA, EEA, PVB, silicone resin, urethane resin, acrylic resin, epoxy resin or the like may be used. The rear face filler 7 may have no translucency, unlike the light-receiving face filler 6. Thus, the rear face filler 7 may use a colored resin film. A resin film colored in a similar color to a solar cell may be used for designability, or a resin film colored white may be used to diffuse light well.

The rear face protecting member 9 uses a plate or a film having weather resistance, such as humidity resistance. As the rear face protecting member 9, like the light-receiving face protecting member 8, a glass plate, a resin plate, a resin film or the like may be used. The rear face protecting member 9 may have no translucency, unlike the light-receiving protecting member 8. Thus, the rear face protecting member may be an opaque plate or film. A laminated film of, for example, a resin film including an aluminum foil therein may be used.

The solar cell connection unit 10 is configured by connecting a plurality of solar cell strings 2. Hereinafter, a configuration of the solar cell string 2 will be described in detail.

(Configuration of Solar Cell String)

In the solar cell string 2, a plurality of solar cells 3 are arranged in a row, a connection member 5 is arranged so as to straddle the adjacent solar cells 3, and the adjacent solar cells 3 are electrically connected.

A rear face of the solar cell 3 to be used has a p-side electrode 11 and an n-side electrode 12. The p-side electrode 11 includes a fine line electrode 11a and a collecting electrode 11b which collects positive holes collected by the fine line electrode 11a. The n-side electrode 12 includes a fine line electrode 12a and a collecting electrode 12b which collects electrons collected by the fine line electrode 12a. A plurality of the fine line electrodes 11a and the fine line electrodes 12a, each of which has a linear form, are arranged alternately in a p region and an n region, respectively, such that an extending direction of the fine line electrodes 11a is the same as that of the fine line electrodes 12a and the fine line electrodes 11a and the fine line electrodes 12a are alternately arranged in a direction crossing the extending direction. The collecting electrode 11b and the collecting electrode 12b are formed at both ends in the extending direction of the fine line electrode 11a and the fine line electrode 12a such that the collecting electrode 11b faces the collecting electrode 12b. The collecting electrode 11b and the collecting electrode 12b are connected to the fine line electrode 11a and the fine line electrode 12a, respectively. That is, the p-side electrode 11 and the n-side electrode 12 each have a similar comb-like shape in the p region and the n region, respectively. The p-side electrode 11 and the n-side electrode 12 are arranged with the comb-like shapes engaging with each other.

The p-side electrode 11 and the n-side electrode 12 may be a metal layer (e.g., copper, tin or nickel), or a laminated body including a transparent conductive film (TCO) formed of translucent conductive oxide (e.g., indium oxide ($In_2O_3$)) and a metal layer (e.g., copper, tin or nickel).

Each of the fine line electrode 11a and the fine line electrode 12a preferably has a length in a width direction, which crosses the extending direction, of approximately 1.5 mm to 3 mm, and preferably has a thickness of approximately 20 μm to 160 μm. Each of the collecting electrode 11b and the collecting electrode 12b preferably has a length in a width direction, which crosses the extending direction, of approximately 1.5 mm to 3 mm, and preferably has a thickness of 20 μm to 160 μm.

The solar cell 3 may have a back contact type heterojunction. In this case, a substrate formed of n-type crystal silicon may be used, an i-type amorphous silicon layer and a p-type amorphous silicon layer may be laminated in order from the substrate side to the p-type region, and an i-type amorphous silicon layer and an n-type amorphous silicon layer may be laminated in order in the n-type region. Alternatively, the solar cell 3 may be a diffusion and back contact solar cell, or a solar cell having a rear face on which a p-type electrode and an n-type electrode are formed with a through hole.

The connection member 5 is a wiring material connecting the adjacent solar cells 3 electrically. In the present embodiment, as the connection member 5, a flexible printed circuit board (FPC), in which a conductive thin film is placed on one side of a flexible insulating sheet, is used. More specifically, the FPC, in which a copper foil 16 having a predetermined shape is formed on a polyimide resin film 15, is used. An area of the predetermined shape is smaller than an area of the resin film when viewed from one side in an overlapping direction of the resin film and the foil. Alternatively, a thin film formed of a metal conductive material (e.g., copper) may be used. Further, a stranded wire-like member may be used instead of the thin film. For the foil, the thin film and the stranded wire, in addition to copper, silver, aluminum, nickel, tin, gold or alloy of these metals may be used.

(Connection Structure Between Solar Cells 3)

Hereinafter, a description will be given of a connection structure of the solar cell string 2 with use of FIG. 2. In the following description, for convenience of explanation, one of two adjacent solar cells 3 is referred to as a solar cell 3A, and the other a solar cell 3B to distinguish the two solar cells 3 from each other. Between the two adjacent solar cells 3, collecting electrodes having different polarities are arranged to face each other. That is, the solar cells 3A and 3B are arranged such that the collecting electrode 12b at the n side of the solar cell 3A faces the collecting electrode 11b at the p side of the solar cell 3B. The connection member 5 is arranged so as to straddle the n-side electrode 12 of the solar cell 3A and the p-side electrode 11 of the solar cell 3B. More specifically, in the present embodiment, the connection member 5 is arranged so as to overlap the copper foil 16 of the connection member 5 with the collecting electrode 12b of the solar cell 3A and the collecting electrode 11b of the solar cell 3B. The connection member 5 and the solar cell 3A having been overlapped with each other, and the connection member 5 and the solar cell 3B having been overlapped with each other, are physically fixed by an adhesive 4 to be connected with each other.

As the adhesive 4, heat-curable resin which may be acrylic, flexible polyurethane, and epoxy, is used. The adhesive 4 is not limited to insulating materials. The adhesive 4 may be an anisotropic conductive material containing conductive particles. As the conductive particles, nickel, silver, gold-coated nickel, tin-coated copper or the like may be used.

(Production Method for Solar Cell String 2)

Figure 3:
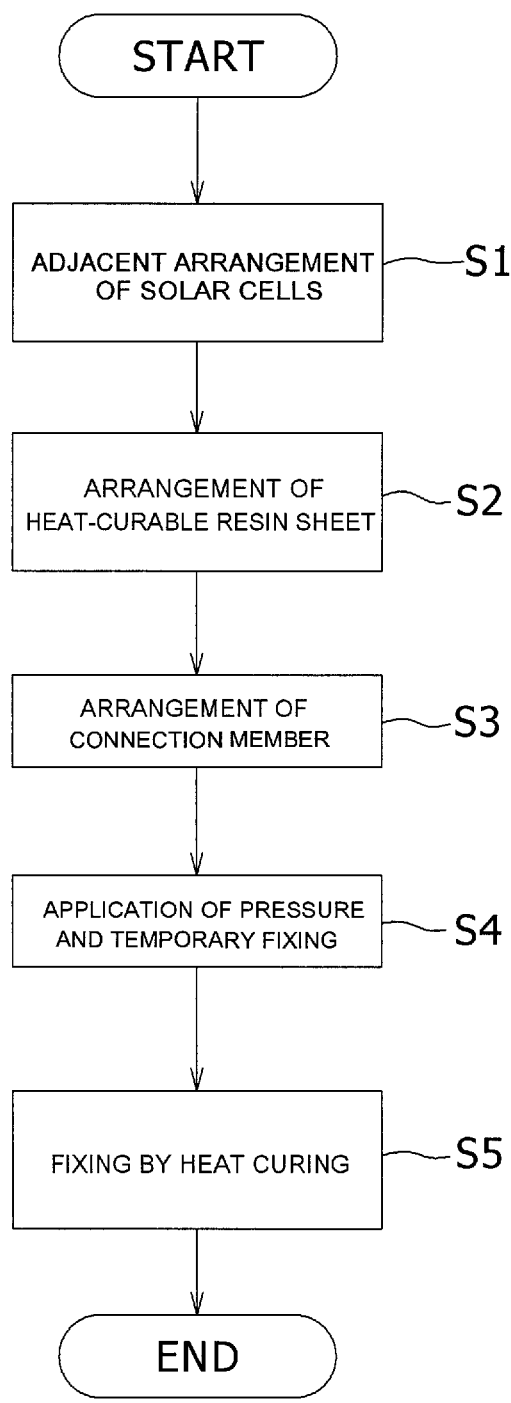
FIG. 3 is a flowchart illustrating a procedure of the production method for a solar cell module of the example of the embodiment of the present invention.

FIG. 3 is a flowchart illustrating a procedure of a production method for the solar cell module 1. First, a plurality of the solar cells 3 are prepared. The adjacent solar cells 3A and 3B are arranged with a predetermined space such that the collecting electrode 12b at the n side of the solar cell 3A faces the collecting electrode 11b at the p side of the solar cell 3B (first step by first means, S1 in FIG. 3).

Next, a heat-curable resin sheet 4A to become the adhesive 4 is prepared. The heat-curable resin sheet 4A is arranged on both the collecting electrode 12b at the n side of the solar cell 3A and the collecting electrode 11b at the p side of the solar cell 3B (second step by second means, S2 in FIG.

3). The heat-curable resin sheet 4A to be used has, for example, a rectangular shape. The present embodiment uses the heat-curable resin sheet 4A to become the adhesive 4 which is formed on a release sheet 4B.

Figure 4:
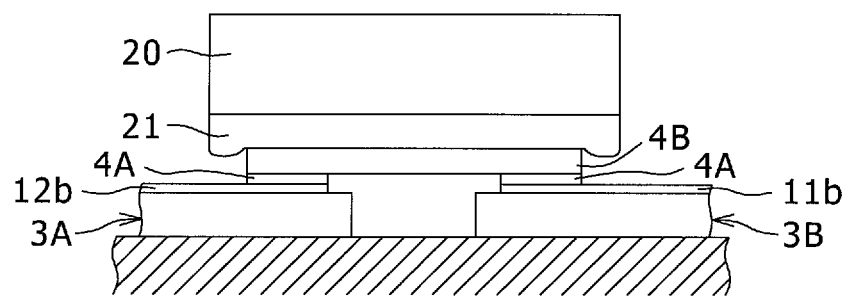
FIG. 4 is a diagram illustrating a bonding step in the production method for a solar cell module of the example of the embodiment of the present invention.

As illustrated in FIG. 4, the heat-curable resin sheet 4A formed on the release sheet 4B is pressed against the collecting electrode 12b at the n side of the solar cell 3A and the collecting electrode 11b at the p side of the solar cell 3B simultaneously, for pressure bonding. In the present step, a pressurizing device that has a configuration in which a pressurizing face of a pressure applying section 20 has a cushion section 21 formed of an elastic material (e.g., rubber) to apply pressure to a pressurized area uniformly is used. After pressure bonding of the heat-curable resin sheet 4A to the collecting electrode 12b and the collecting electrode 11b, the heat-curable resin sheet 4A is released from the release sheet 4B. In this way, a bonding step of bonding the heat-curable resin sheet 4A to the collecting electrode 12b and the collecting electrode 11b is performed.

In bonding the heat-curable resin sheet 4A to the solar cells 3A and 3B, to make the bonding easier, the heat-curable resin sheet 4A may be softened by being heated at a temperature which does not cause deformation or curing of the heat-curable resin sheet 4A before or during the pressure bonding. In the present embodiment, the adhesive 4, an anisotropic conductive film (ACF) formed of heat-curable resin, which may be epoxy, is used. Thus, at approximately 60° C., which is not more than a reaction start temperature of 100° C., heating in a shorter time period and pressurization at a lower pressure than in a fixation step of curing the heat-curable resin sheet 4A are performed to make the bonding easier. The fixation step will be described later.

Next, the connection member 5 is arranged on the heat-curable resin sheet 4A on the solar cell 3A and the solar cell 3B (third step by third means, S3 in FIG. 3). As the connection member 5, an FPC in which the copper foil 16 having a predetermined shape is formed on the polyimide resin film 15 is used. In this case, the connection member 5 is arranged on the heat-curable resin sheet 4A on the collecting electrode 12b at the n side of the solar cell 3A and the collecting electrode 11b at the p side of the solar cell 3B. More specifically, the connection member 5 is arranged so as to overlap the copper foils 16 of the connection member 5 with the collecting electrode 12b and the collecting electrode 11b.

Figure 5:
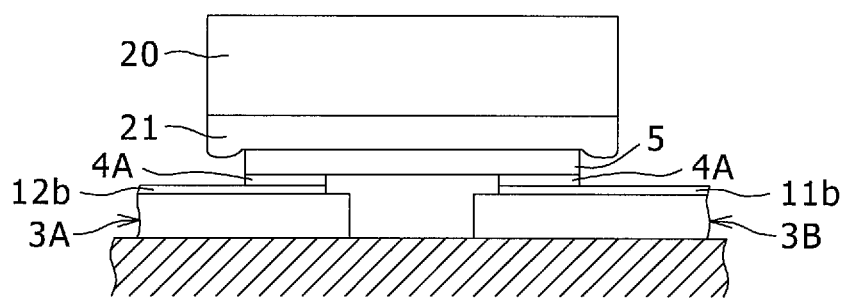
FIG. 5 is a diagram illustrating a temporary fixation step in the production method for a solar cell module of the example of the embodiment of the present invention.

As illustrated in FIG. 5, pressure is applied simultaneously to sections of the connection member 5 which are positioned on the solar cells 3A and 3B, and the heat-curable resin sheet 4A is temporarily fixed to the collecting electrode 12b at the n side of the solar cell 3A and the collecting electrode 11b at the p side of the solar cell 3B (fourth step by fourth means, S4 in FIG. 3). A pressurizing device used in the present step has a configuration in which a pressurizing face of a pressure applying section 20 has a cushion section 21 formed of an elastic material (e.g., rubber) to apply pressure to a pressurized area uniformly. The elastic material has appropriate elasticity and thickness. Thus, during the pressurizing, occurrence of position displacement of the connection member 5 and the solar cells 3A and 3B is prevented.

In the present embodiment, at approximately 60° C., which is not more than a reaction start temperature of an ACF of 100° C., heating in a shorter time period and pressurization at a lower pressure than in the fixation step of curing the heat-curable resin sheet 4A are performed, as in the bonding step by the adhesive. The fixation step will be described later. Pressure is applied to the heat-curable resin sheet 4A having been softened, and thus, the bonding is completed. In this way, the temporary fixation of connecting the connection member 5 and the solar cell 3A and connecting the connection member 5 and the solar cell 3B physically is performed.

In the arrangement of the connection member 5, an alignment mark may be set on each of the connection member 5, the solar cells 3A and 3B, to arrange the copper foil 16 of the connection member 5 on the collecting electrode 12b at the n side of the solar cell 3A and the collecting electrode 11b at the p side of the solar cell 3B.

Next, the heat-curable resin sheet 4A is cured and made to be the adhesive 4. Thus, the connection member 5 is physically and electrically connected to the collecting electrode 12b at the n side of the solar cell 3A and the collecting electrode 11b at the p side of the solar cell 3B. Heat and pressure are applied simultaneously to the sections of the connection member 5 that overlap the solar cell 3A and the solar cell 3B and the heat-curable resin sheet 4A is cured. In the present embodiment, while higher pressure is applied than in the bonding step or the temporary fixation step, heating is performed at a temperature that is not less than a reaction start temperature of the heat-curable resin sheet 4A of 100° C. to cure the heat-curable resin sheet 4A. Thus, the heat-curable resin sheet 4A is made to be the adhesive 4. In this way, the fixation step of connecting the connection member 5 and the solar cell 3A and connecting the connection member 5 and the solar cell 3B electrically and physically is performed (fifth step by fifth means, S5 in FIG. 3). In the present step, a device in which a pressurizing face of a pressure applying section 20 has a cushion section 21 formed of an elastic material (e.g., rubber), which is illustrated in FIG. 5, is used, as in the temporary fixation step, and the heating condition and the pressurization condition are changed.

Next, a plurality of the solar cell strings 2 are connected to form the solar cell connection unit 10. The light-receiving face protecting member 8, the light-receiving face filler 6, the solar cell connection unit 10, the rear face filler 7 and the rear face protecting member 9 are laminated in this order. These laminated members are heated and integrated. In this way, the solar cell module 1 is formed. At ends of the light-receiving face protecting member 8 and the rear face protecting member 9, a frame formed of metal (e.g., aluminum) may be arranged.

As described above, in the embodiment of the present invention, pressure is applied simultaneously to the sections of the connection member 5 that overlap the solar cell 3A and the solar cell 3B. Consequently, pressure can be applied reliably to the sections of the connection member 5 that overlap the solar cell 3A and the solar cell 3B, from a normal direction of the rear faces of the solar cells 3A and 3B. As a result, no pressure is applied to the ends of the solar cells 3A and 3B when the connection member 5 is connected to the solar cells 3A and 3B, and thus, chipping or cracking can be prevented more preferably.

More specifically, by fixing both ends of the connection member 5 simultaneously to the solar cells 3A and 3B, chipping or cracking of the solar cells 3 can be prevented more preferably. For example, if the p-side electrode 11 and the n-side electrode 12 are formed by plating or the like, concentration of electric field in a certain area may generate a protrusion. In this case, pressure is applied to the projection having come into contact with the connection member 5. Accordingly, chipping or cracking of the solar cells 3 can be prevented more preferably. In a case where an FPC is used, disconnection of wiring, which may be caused by pressure on the copper foil 16 formed on the polyimide resin film 15 having come into contact with an edge or a projection of the electrode of the solar cells 3A and 3B, can be prevented more preferably. Therefore, in the temporary fixation step as a particularly preferable step, pressure is applied simultaneously to the sections of the connection member 5 that overlap the solar cells 3A and 3B.

In addition, in the embodiment of the present invention, the temporary fixation step is followed by the fixation step in which fixation is made by the adhesive 4. That is, after the connection member 5 is temporarily fixed to appropriate positions of the solar cell 3A and the solar cell 3B, the heat-curable resin sheet 4A is melted and cured to become the adhesive 4 so that fixation is completed. As a result, in heating and pressurization of the heat-curable resin sheet 4A, a position displacement amount of the copper foil 16 of the connection member 5 arranged on the collecting electrode 12b at the n side of the solar cell 3A and the collecting electrode 11b at the p side of the solar cell 3B can be reduced. Accordingly, disconnection of wiring, which may be caused by the connection member 5 contacting another member, can be prevented more preferably.

The aforementioned dimensions, materials, temperatures or the like are illustrative only. Modification can be made as appropriate, for example, depending on a specification of a solar cell module. For example, in the above embodiment, the configuration in which the connection member 5 is connected to the collecting electrode 12b at the n side of the solar cell 3A and the collecting electrode 11b at the p side of the solar cell 3B has been described. However, the present invention is not limited to this configuration. In a solar cell having no collecting electrode, the connection member 5 may be connected to the fine line electrode 12a at the n side of the solar cell 3A and the fine line electrode 11a at the p side of the solar cell 3B.

In this case, the connection member 5 is electrically connected directly to each of the fine line electrodes 11a and 12a. Thus, if an FPC is used as the connection member 5, the shape of the copper foil 16 corresponds to the fine line electrodes 11a and 12a. More specifically, the copper foil 16 has a configuration in which connection parts to the fine line electrode 11a and connection parts to the fine line electrode 12a extend alternatively from a linear part that extends in a direction crossing the extending direction of the fine line electrodes 11a and 12a.

However, in the connection step of the connection member 5, if an ACF is used as the adhesive 4, a pressurizing/heating device having a shape corresponding to the fine line electrode 12a of the solar cell 3A and the fine line electrode 11a of the solar cell 3B enables partial electrical conduction and physical bonding. In this case, accordingly, the copper foil 16 does not need to have a shape corresponding to the fine line electrodes 11a and 12a while the copper foil 16 only needs to overlap the fine line electrodes 11a and 12a. The copper foil 16 may have any shape, for example, a rectangular shape.

INDUSTRIAL APPLICABILITY

The present invention is applicable to the production of solar cell modules.

REFERENCE SIGNS LIST 1 solar cell module, 2 solar cell string, 3, 3A, 3B solar cell, 4 adhesive, 4A heat-curable resin sheet, 4B release sheet, 5 connection member, 6 light-receiving face filler, 7 rear face filler, 8 light-receiving face protecting member, 9 rear face protecting member, 10 solar cell connection unit, 11 p-side electrode, 11a, 12a fine line electrode, 11b, 12b collecting electrode, 12 n-side electrode, 15 polyimide resin film, 16 copper foil, 20 pressure applying section, 21 cushion section.

The invention claimed is:

1. A production method for a solar cell module comprising:
a first step in which a first solar cell and a second solar cell are arranged so as to be adjacent to each other;
a second step in which an adhesive is arranged on the first solar cell and the second solar cell;
a third step in which a connection member is arranged upon the adhesive, so as to overlie an electrode located on a first side of the first solar cell and an electrode located on a first side of the second solar cell, wherein a member obtained by forming a metal wiring pattern on a flexible substrate which is an insulating resin sheet is used as the connection member, and wherein an area of the wiring pattern is smaller than an area of the flexible substrate when viewed from one side in an overlapping direction of the flexible substrate and the wiring pattern;
a fourth step in which pressure is applied by one pressure applying face simultaneously to sections of the connection member that overlap the first solar cell and the second solar cell, and the connection member is temporarily fixed to the first solar cell and the second solar cell; and
a fifth step in which the connection member is fixed to the first solar cell and the second solar cell by curing the adhesive.

2. The production method for a solar cell module according to claim 1, wherein a film-shaped member is used as the adhesive.

3. The production method for a solar cell module according to claim 1, wherein the first solar cell comprises a p-side electrode on the first side; and the second solar cell comprises an n-side electrode on the first side.

4. The production method for a solar cell module according to claim 1, wherein a resin forming the flexible substrate is a polyimide resin.

* * * * *